US012603478B2

(12) United States Patent
Watanabe et al.

(10) Patent No.: US 12,603,478 B2
(45) Date of Patent: Apr. 14, 2026

(54) SEMICONDUCTOR LASER AND SEMICONDUCTOR LASER DEVICE

(71) Applicant: SONY GROUP CORPORATION, Tokyo (JP)

(72) Inventors: Hideki Watanabe, Kumamoto (JP); Yuichiro Kikuchi, Kumamoto (JP); Shinichi Agatuma, Kumamoto (JP); Makoto Oota, Kumamoto (JP); Takashi Mizuno, Kumamoto (JP); Hiroyuki Miyahara, Kumamoto (JP); Eiji Nakayama, Kumamoto (JP)

(73) Assignee: SONY GROUP CORPORATION, Tokyo (JP)

( * ) Notice: Subject to any disclaimer, the term of this patent is extended or adjusted under 35 U.S.C. 154(b) by 594 days.

(21) Appl. No.: 18/005,089

(22) PCT Filed: Jun. 25, 2021

(86) PCT No.: PCT/JP2021/024217
§ 371 (c)(1),
(2) Date: Jan. 11, 2023

(87) PCT Pub. No.: WO2022/019054
PCT Pub. Date: Jan. 27, 2022

(65) Prior Publication Data
US 2023/0261438 A1 Aug. 17, 2023

(30) Foreign Application Priority Data
Jul. 20, 2020 (JP) ................................. 2020-124038

(51) Int. Cl.
*H01S 5/00* (2006.01)
*H01S 5/0234* (2021.01)
(Continued)

(52) U.S. Cl.
CPC .............. *H01S 5/16* (2013.01); *H01S 5/0234* (2021.01); *H01S 5/0237* (2021.01);
(Continued)

(58) Field of Classification Search
CPC ........ H01S 5/16; H01S 5/0234; H01S 5/0237; H01S 5/04252; H01S 5/162; H01S 5/22;
(Continued)

(56) References Cited

U.S. PATENT DOCUMENTS

| | | | |
|---|---|---|---|
| 7,072,374 B2* | 7/2006 | Matsumura ......... | H01S 5/04252 |
| | | | 372/43.01 |
| 2003/0048818 A1* | 3/2003 | Takeuchi ............ | H01S 5/04252 |
| | | | 372/36 |

(Continued)

FOREIGN PATENT DOCUMENTS

| | | |
|---|---|---|
| JP | 2006-100369 A | 4/2006 |
| JP | 2008-103771 A | 5/2008 |

(Continued)

OTHER PUBLICATIONS

International Search Report and Written Opinion of PCT Application No. PCT/JP2021/024217, issued on Jul. 27, 2021, 08 pages of ISRWO.

*Primary Examiner* — Kinam Park
(74) *Attorney, Agent, or Firm* — CHIP LAW GROUP

(57) ABSTRACT
A semiconductor laser according to one embodiment of the present disclosure includes: a first semiconductor layer of a first conductivity type; an active layer; and a second semiconductor layer of a second conductivity type stacked on the first semiconductor layer with the active layer interposed therebetween, and provided with a strip-shaped ridge. The semiconductor laser further includes: a pair of resonator end faces facing each other across the ridge; and an electrode layer electrically coupled to an upper surface of the ridge.

6 Claims, 17 Drawing Sheets

(51) Int. Cl.

| | |
|---|---|
| *H01S 5/0237* | (2021.01) |
| *H01S 5/042* | (2006.01) |
| *H01S 5/16* | (2006.01) |
| *H01S 5/22* | (2006.01) |
| H01S 5/343 | (2006.01) |

(52) U.S. Cl.
CPC .......... *H01S 5/04252* (2019.08); *H01S 5/162*
(2013.01); *H01S 5/22* (2013.01); *H01S*
*5/04254* (2019.08); *H01S 5/343* (2013.01);
*H01S 5/34333* (2013.01); *H01S 2301/176*
(2013.01)

(58) Field of Classification Search
CPC .. H01S 5/04254; H01S 5/343; H01S 5/34333;
H01S 2301/176
See application file for complete search history.

(56) References Cited

U.S. PATENT DOCUMENTS

| | | | | |
|---|---|---|---|---|
| 2012/0099614 A1* | 4/2012 | Yamazaki | ........... | H01S 5/04254 |
| | | | | 372/46.01 |
| 2017/0346258 A1* | 11/2017 | Kuramoto | ................. | H01S 5/22 |
| 2021/0281038 A1* | 9/2021 | Kouno | ...................... | H01S 5/22 |
| 2023/0335972 A1* | 10/2023 | Isozaki | .............. | H01S 5/02461 |

FOREIGN PATENT DOCUMENTS

| | | |
|---|---|---|
| JP | 2009-094360 A | 4/2009 |
| JP | 2010-010509 A | 1/2010 |
| JP | 2011-023628 A | 2/2011 |
| WO | 2020/110783 A1 | 6/2020 |

* cited by examiner

[ FIG. 1 ]
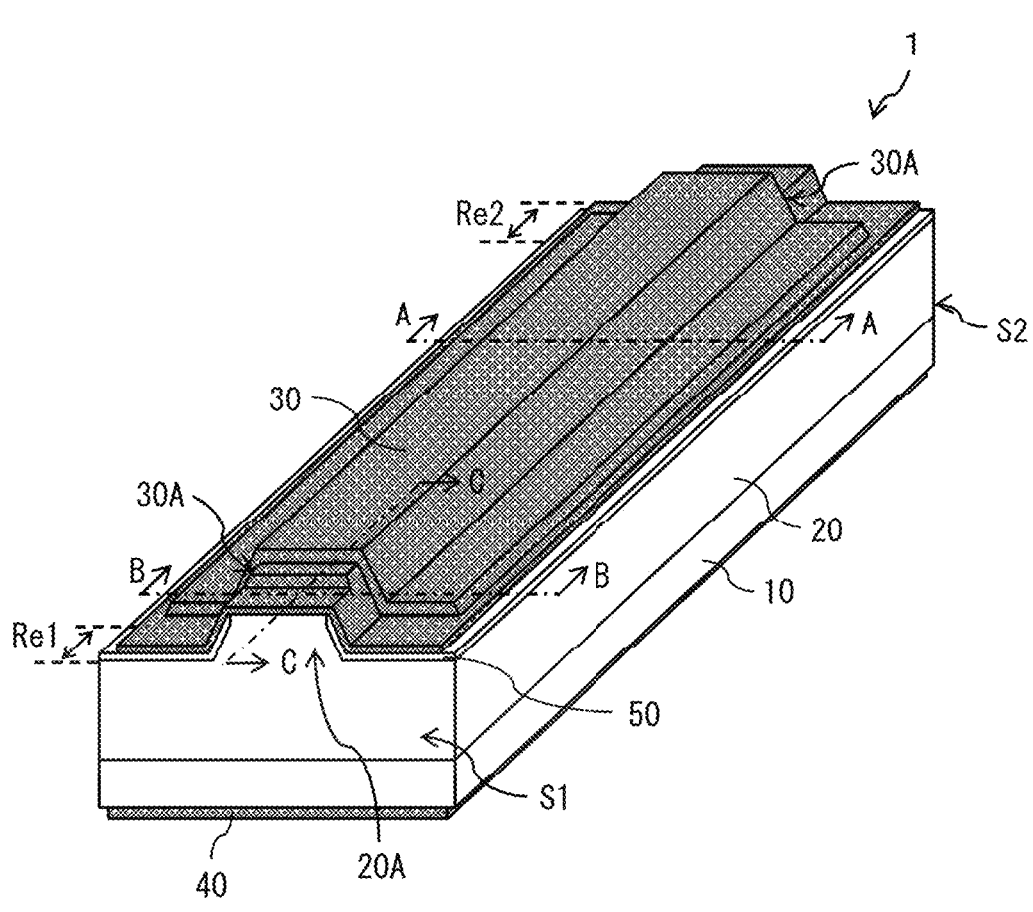

[ FIG. 2 ]
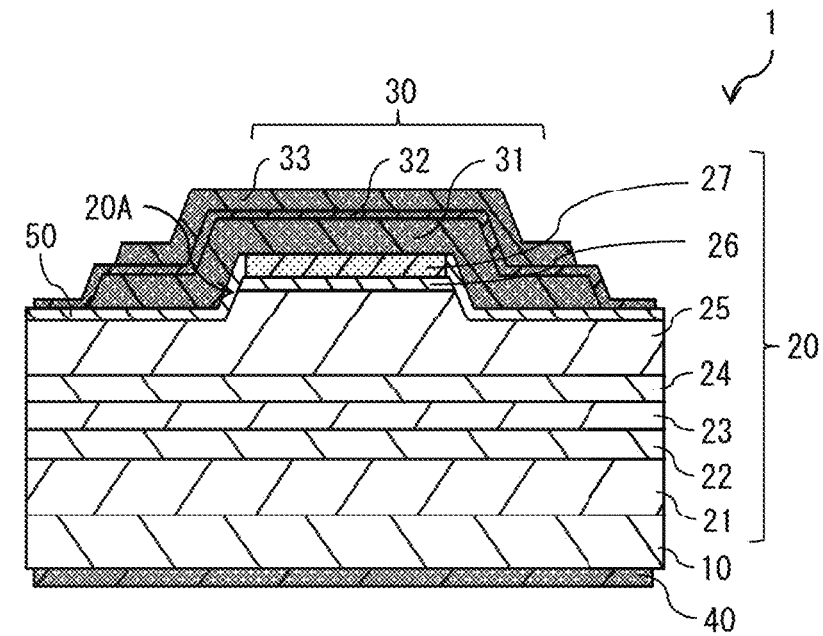
[ FIG. 3 ]
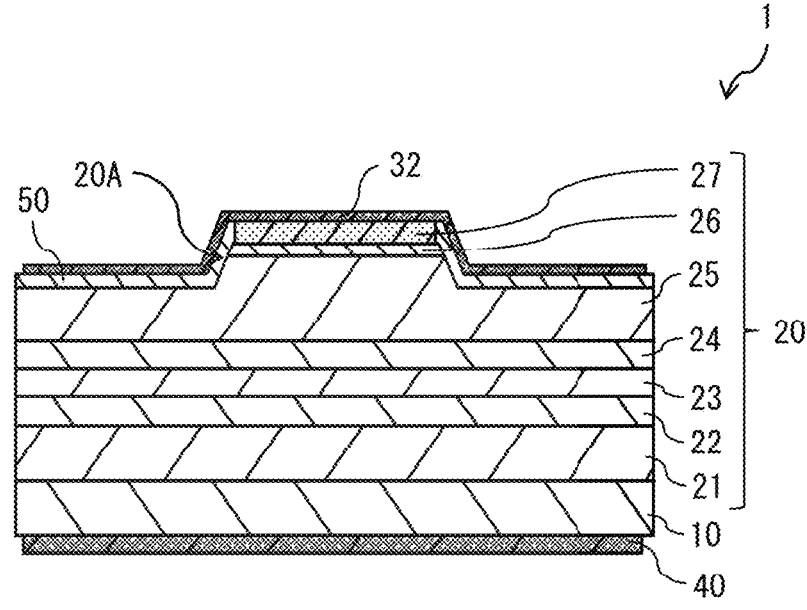

[ FIG. 4 ]
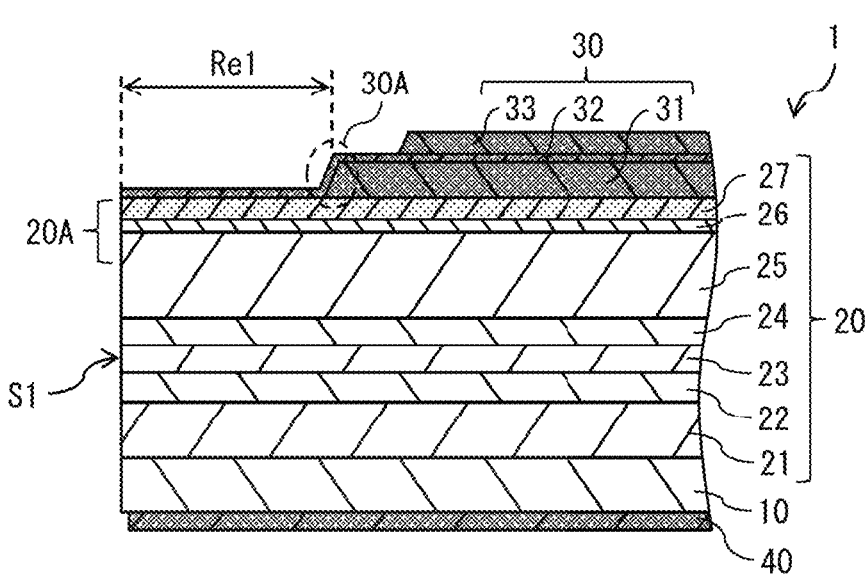

[ FIG. 5A ]
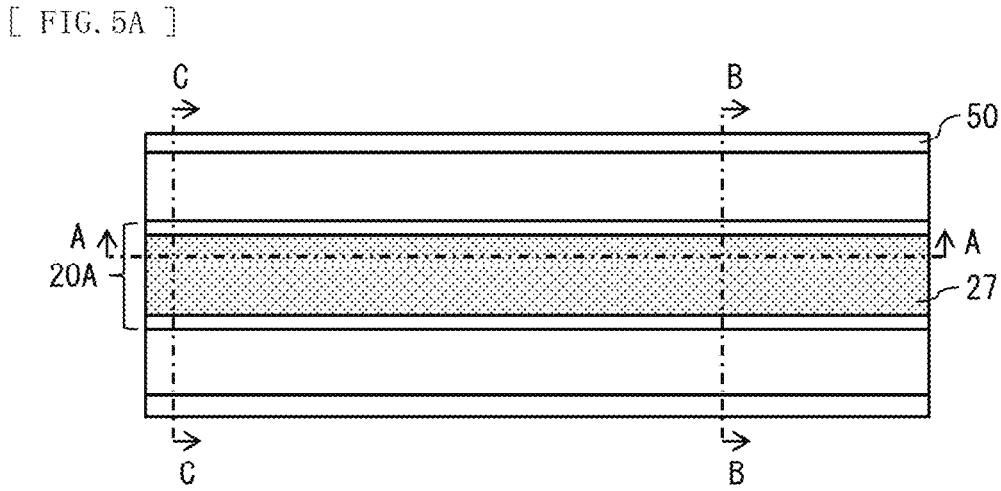
[ FIG. 5B ]
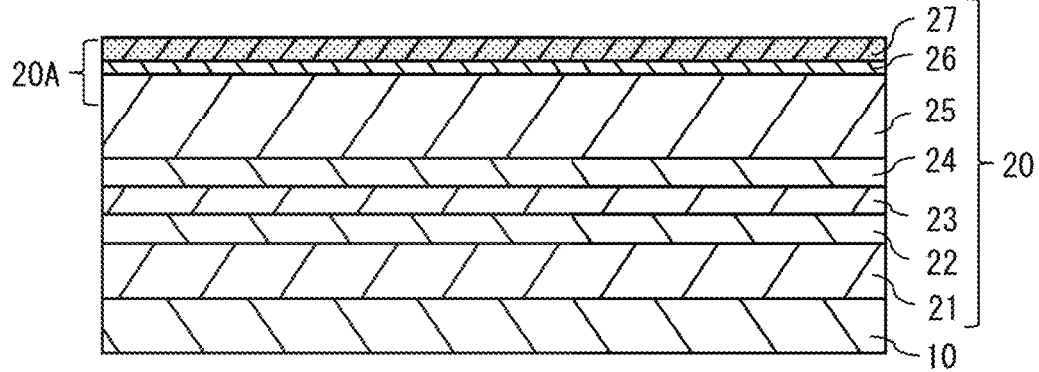

[ FIG. 5C ]
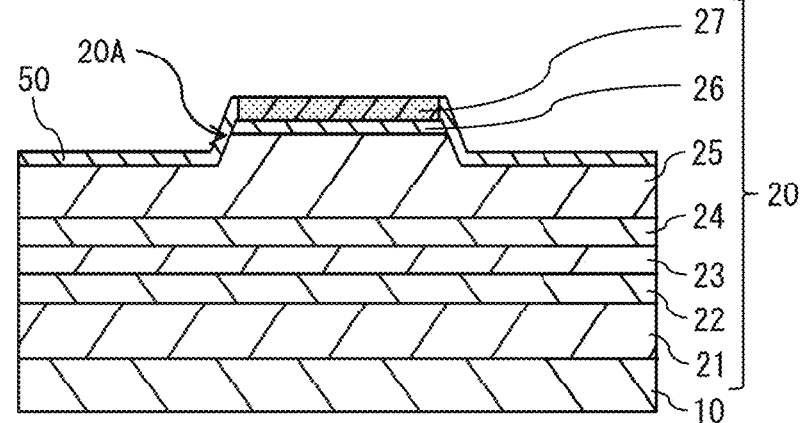
[ FIG. 5D ]
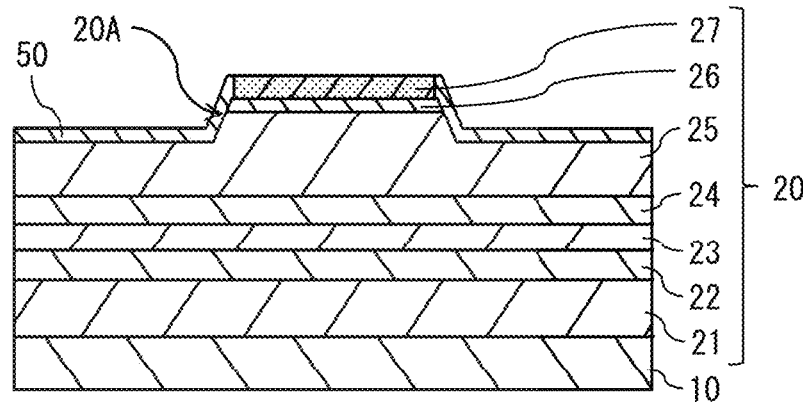

[ FIG. 6A ]
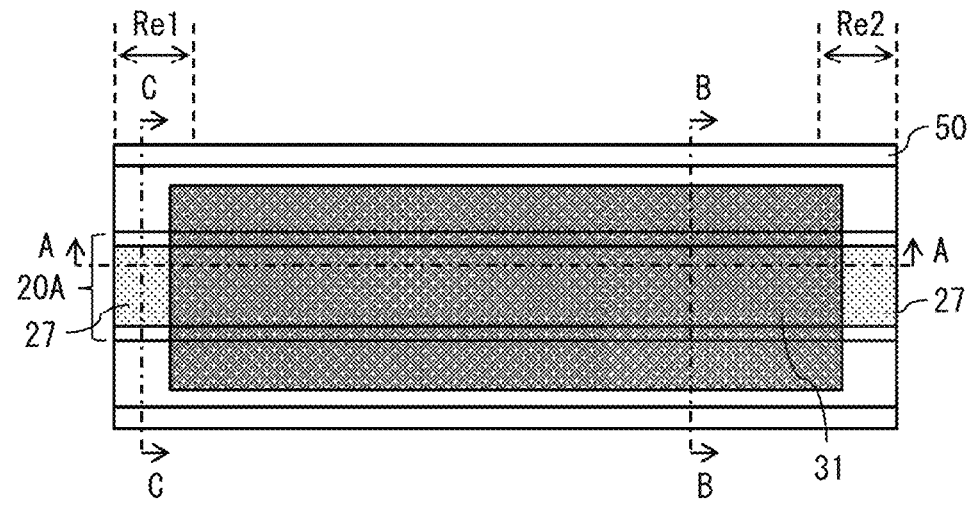
[ FIG. 6B ]
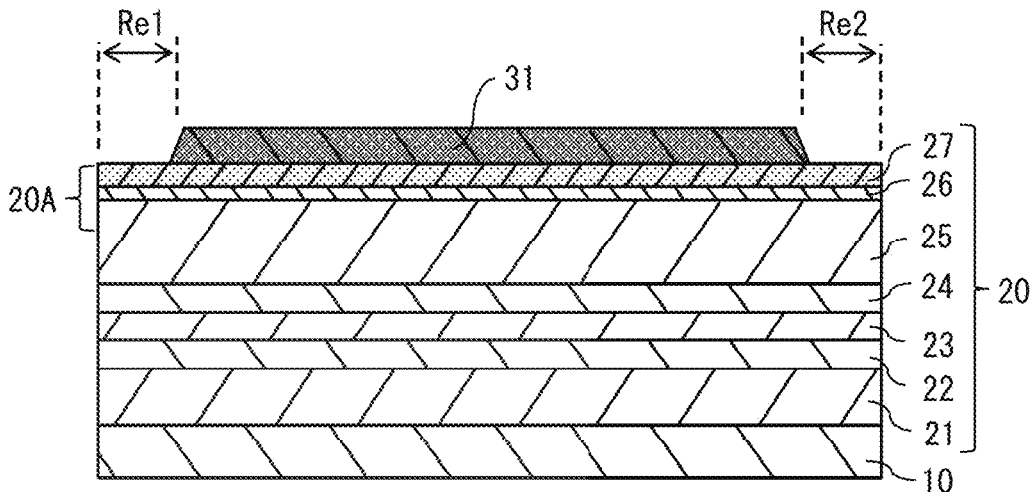

[ FIG. 6C ]
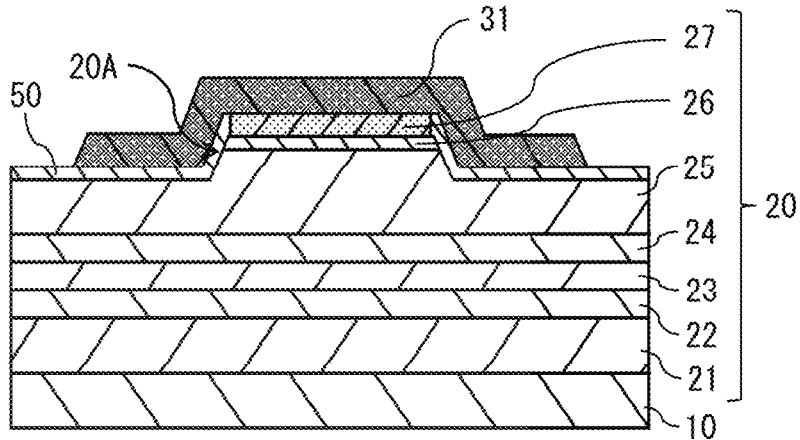
[ FIG. 6D ]
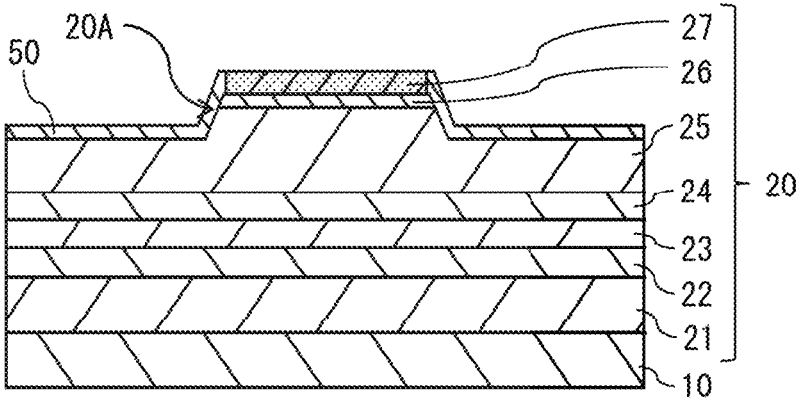

[ FIG. 7A ]
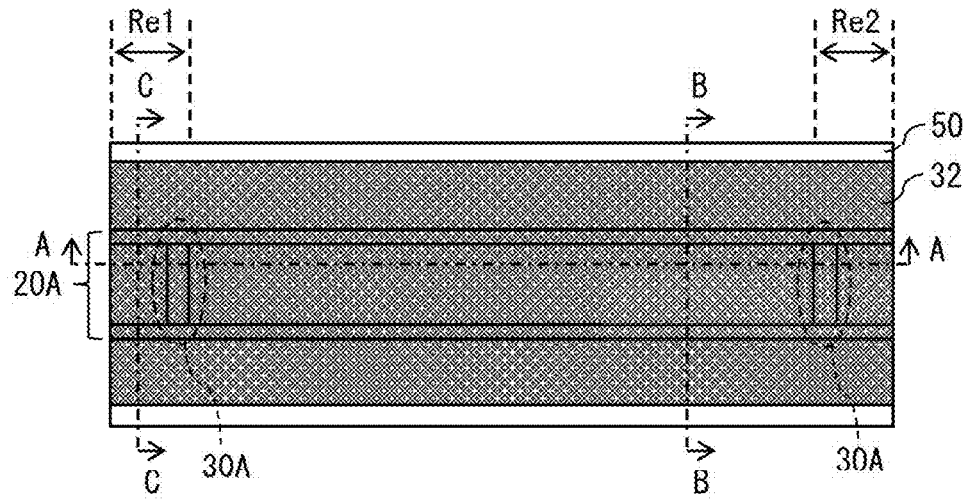
[ FIG. 7B ]
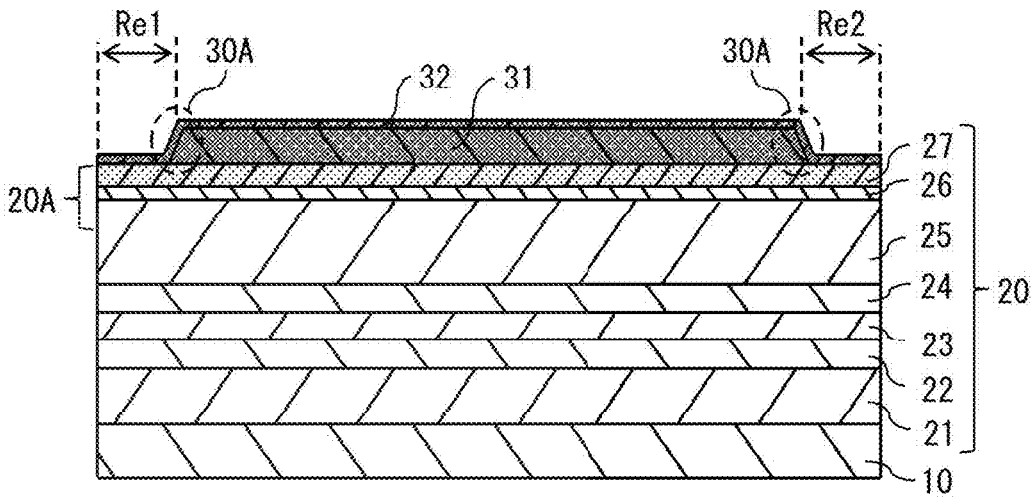

[ FIG. 7C ]
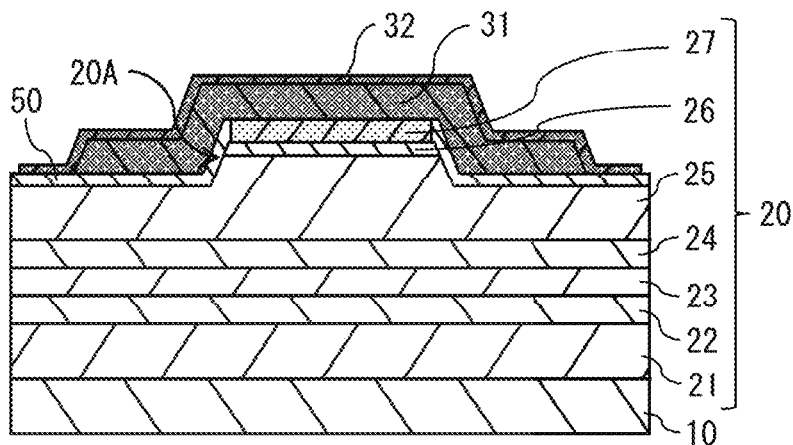
[ FIG. 7D ]
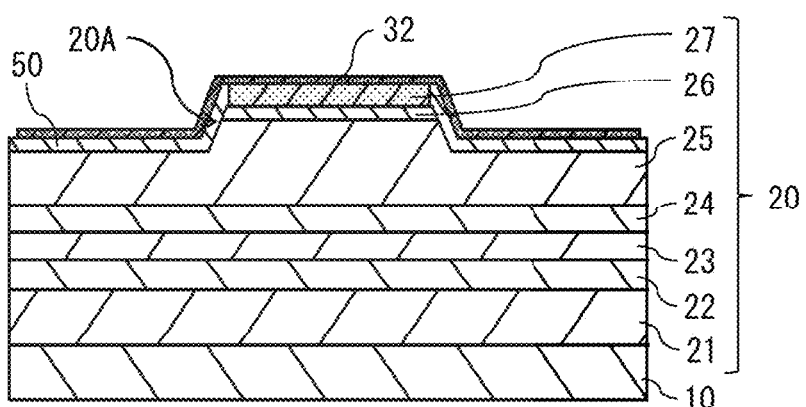

[ FIG. 8A ]
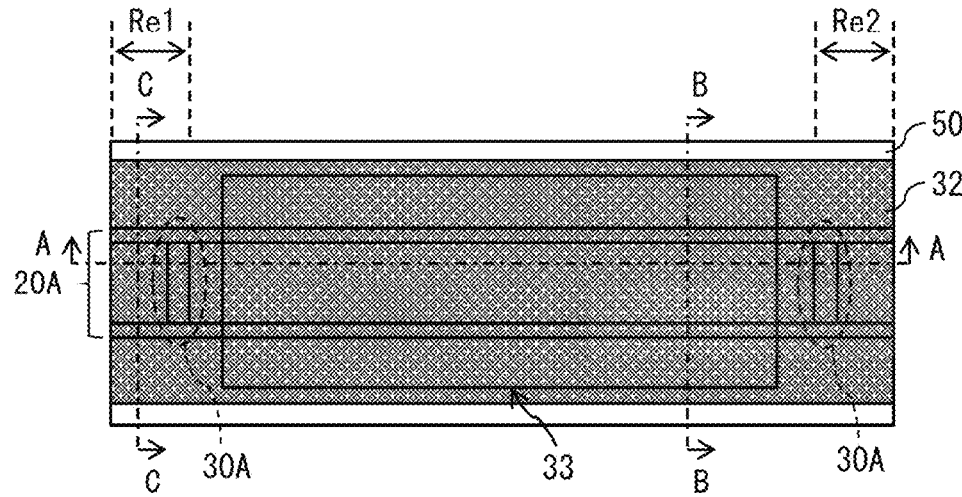
[ FIG. 8B ]
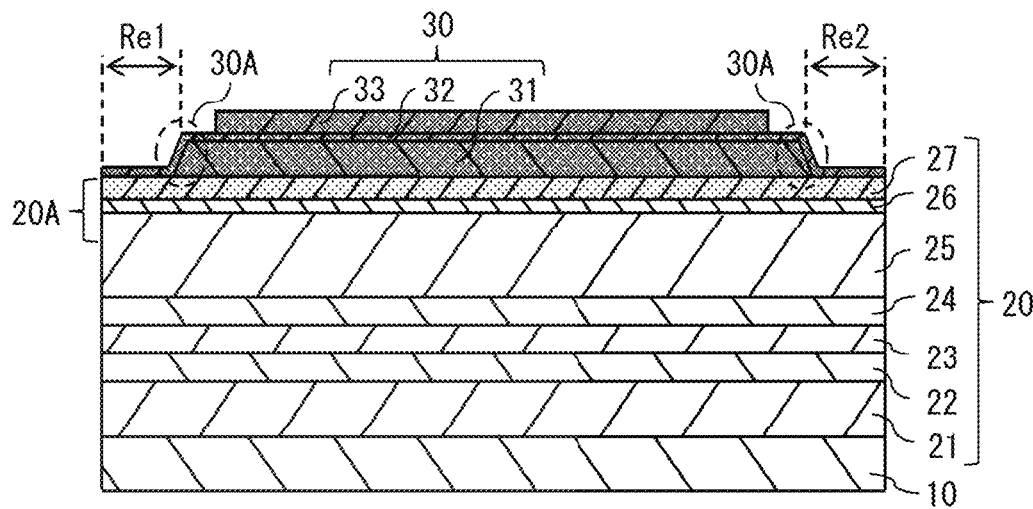

[ FIG. 8C ]
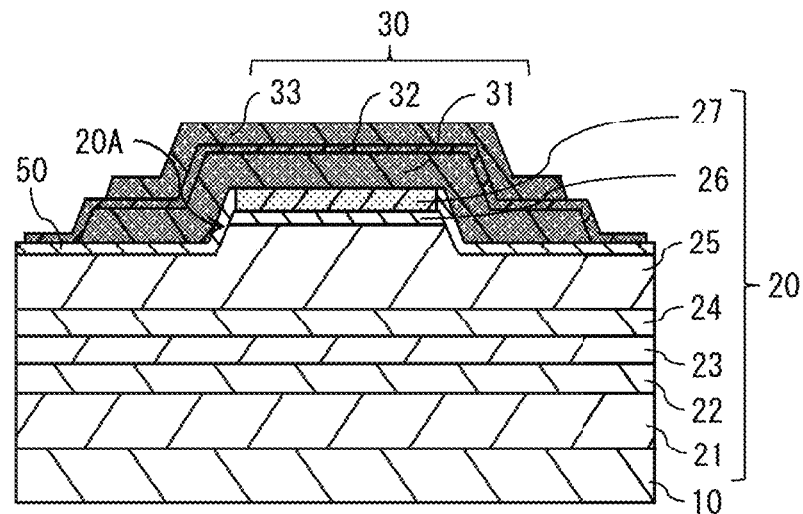
[ FIG. 8D ]
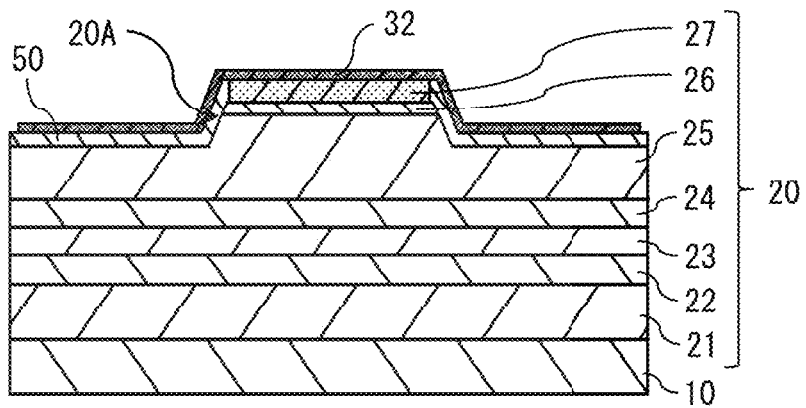

[ FIG. 9 ]
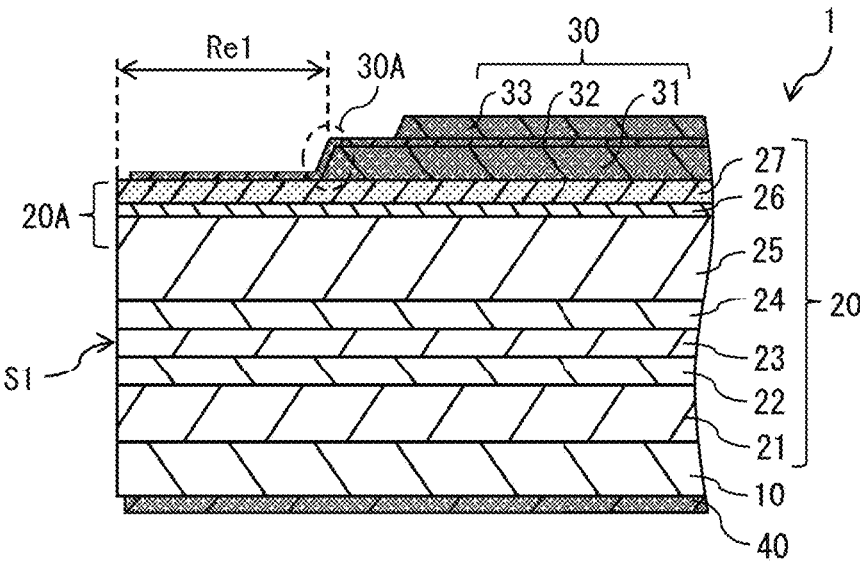
[ FIG. 10 ]
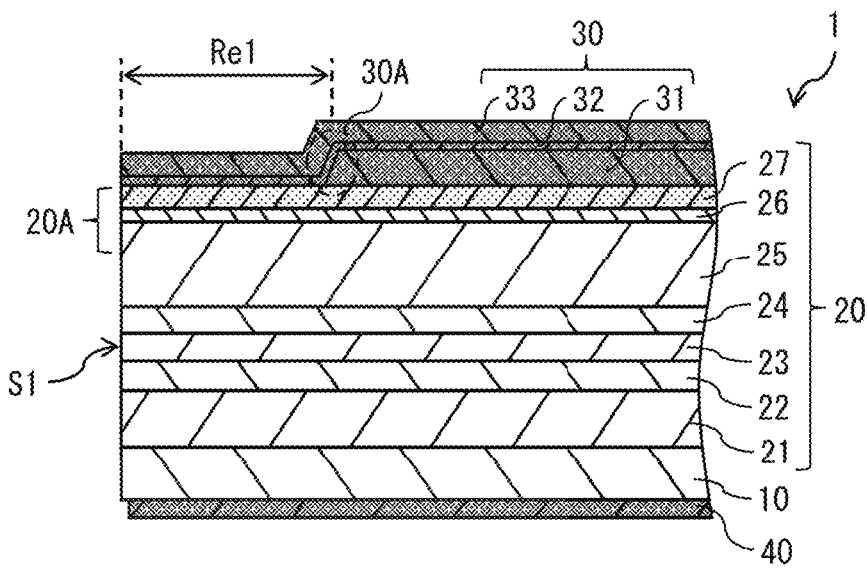

[ FIG. 11 ]
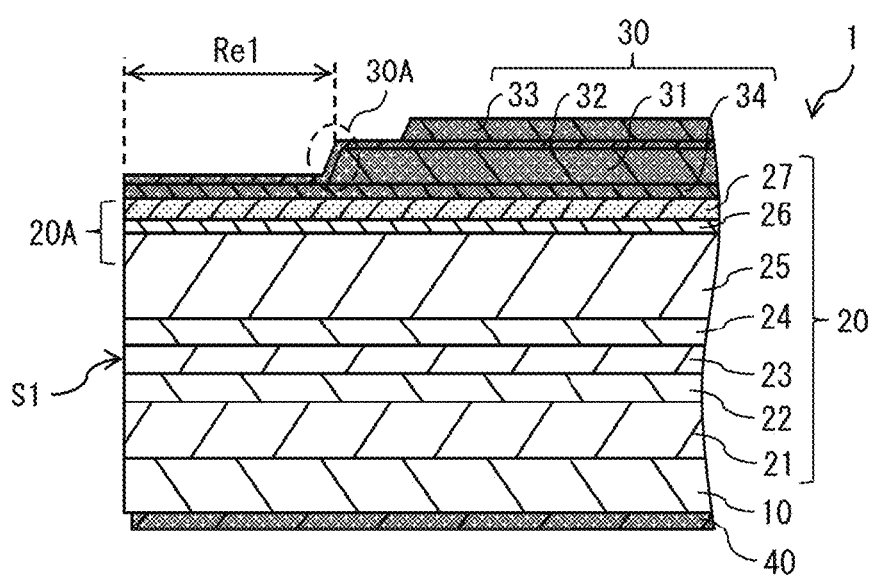
[ FIG. 12 ]
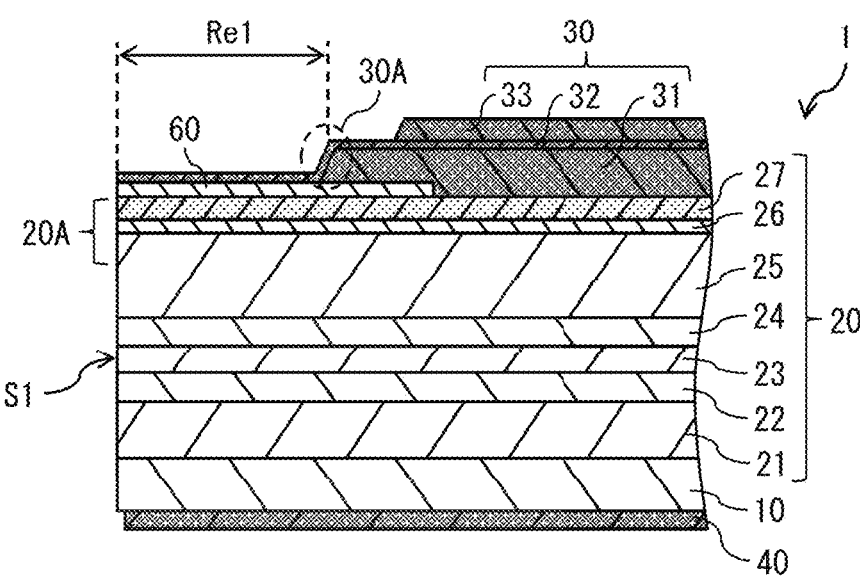

[ FIG. 13 ]
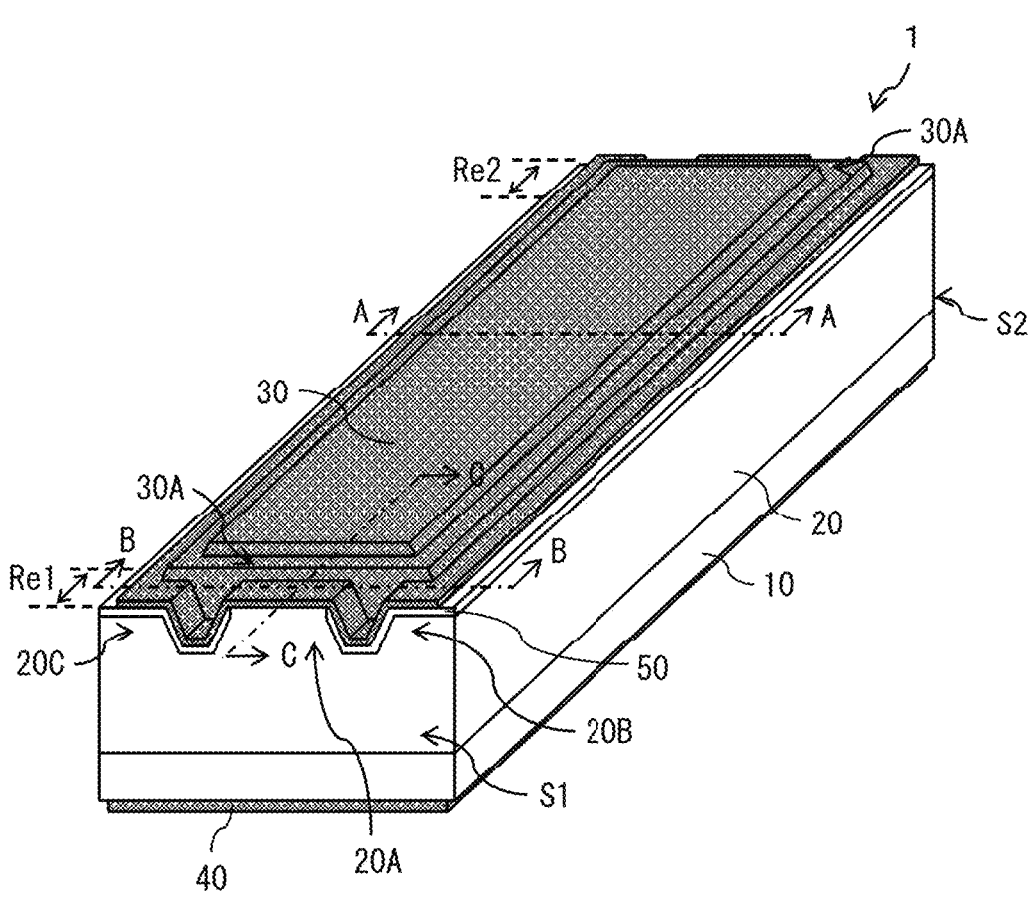

[ FIG. 14 ]
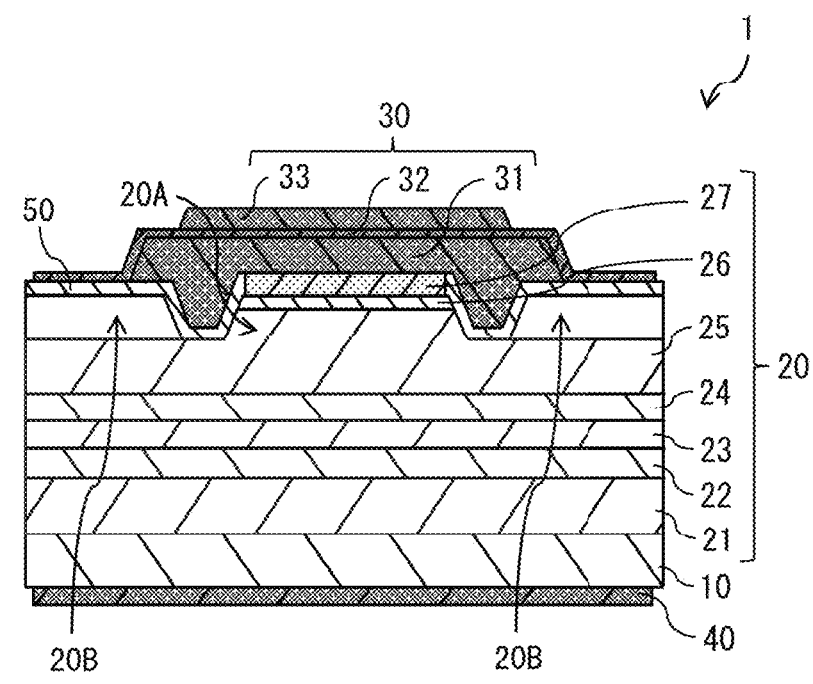
[ FIG. 15 ]
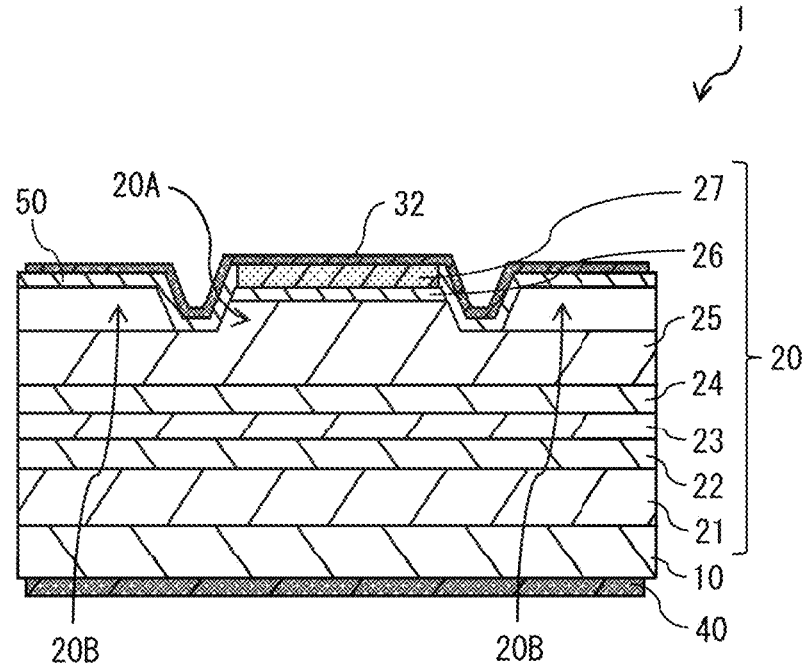

[ FIG. 16 ]
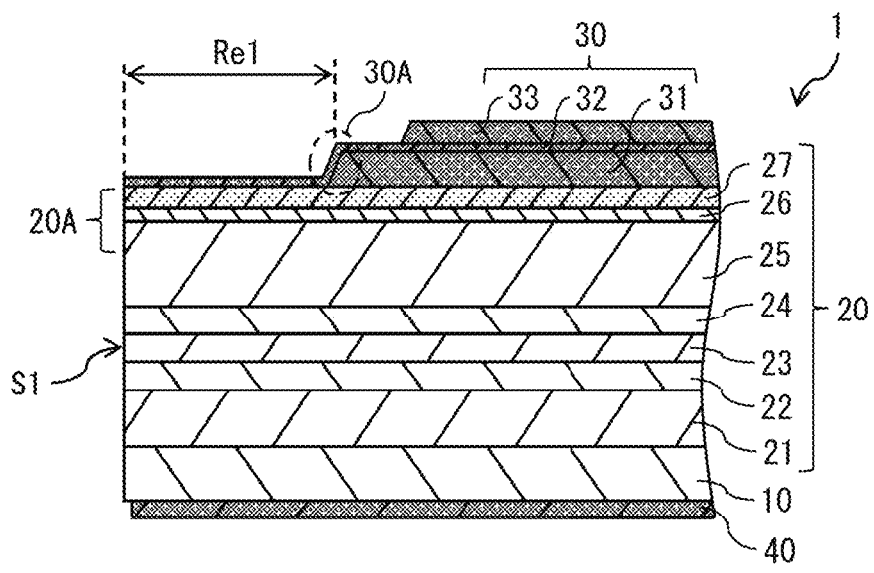

[ FIG. 17 ]
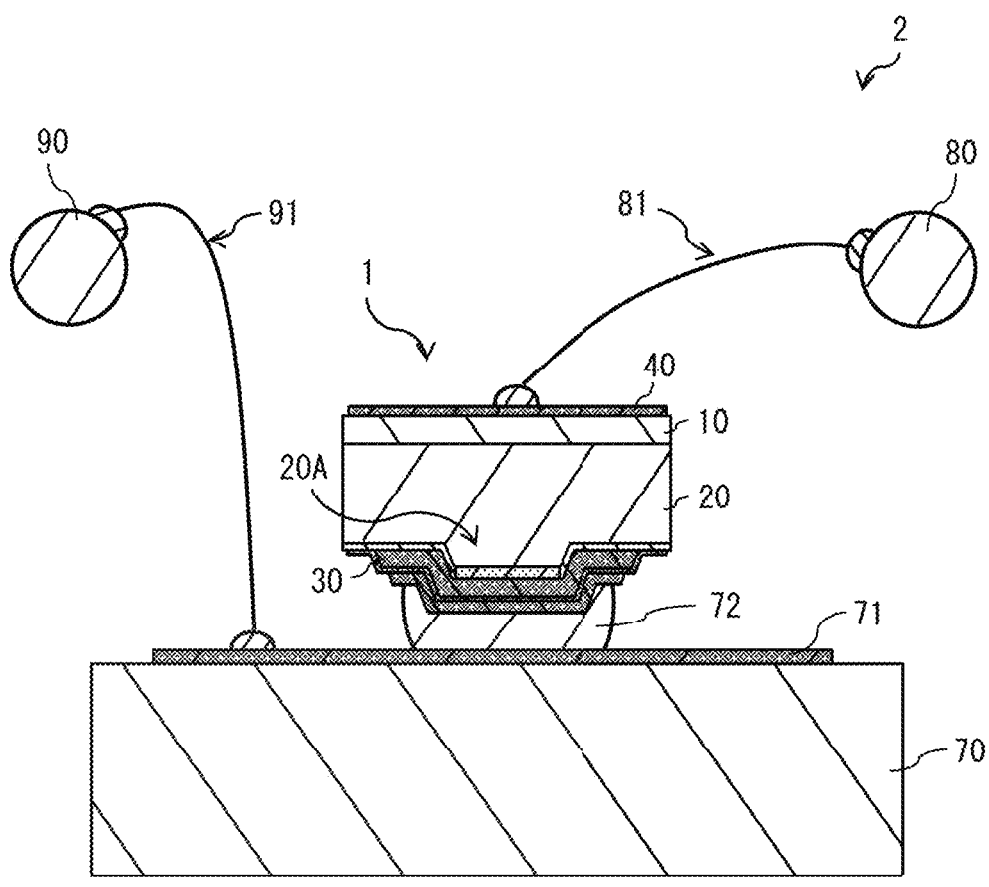

SEMICONDUCTOR LASER AND SEMICONDUCTOR LASER DEVICE

CROSS REFERENCE TO RELATED APPLICATIONS

This application is a U.S. National Phase of International Patent Application No. PCT/JP2021/024217 filed on Jun. 25, 2021, which claims priority benefit of Japanese Patent Application No. JP 2020-124038 filed in the Japan Patent Office on Jul. 20, 2020. Each of the above-referenced applications is hereby incorporated herein by reference in its entirety.

TECHNICAL FIELD

The present disclosure relates to a semiconductor laser and a semiconductor laser device.

BACKGROUND ART

An edge-emitting semiconductor laser is disclosed, for example, in Patent Literature 1 below.

CITATION LIST

Patent Literature

Patent Literature 1: Japanese Unexamined Patent Application Publication No. 2010-10509
Patent Literature 2: Japanese Unexamined Patent Application Publication No. 2009-94360

SUMMARY OF THE INVENTION

In an edge-emitting semiconductor laser, a semiconductor laser is fixed to a heat exhaust member such as a heat sink by a solder in order to suppress an output reduction due to a heat generation. At this time, a component of the solder may diffuse into an electrode layer of the semiconductor laser, degrading a long-term reliability of the semiconductor laser. Therefore, it is desirable to provide a semiconductor laser and a semiconductor laser device that make it possible to suppress a deterioration in long-term reliability caused by a solder.

A semiconductor laser according to one embodiment of the present disclosure includes: a first semiconductor layer of a first conductivity type; an active layer; and a second semiconductor layer of a second conductivity type stacked on the first semiconductor layer via the active layer and provided with a strip-shaped ridge. The semiconductor laser further includes a pair of resonator end faces facing each other across the ridge, and an electrode layer electrically coupled to an upper surface of the ridge.

A semiconductor laser device according to one embodiment of the present disclosure includes: a semiconductor laser; and a connection pad electrically coupled to the semiconductor laser via a solder. The semiconductor laser has the same configuration as the semiconductor laser described above.

In the semiconductor laser and the semiconductor laser device according to one embodiment of the present disclosure, the electrode layer electrically coupled to the upper surface of the ridge includes the first metal layer and the second metal layer. Here, the first metal layer is formed relatively on the ridge side, and formed in a region between the pair of resonator end faces and away from the pair of resonator end faces. The second metal layer covers the entire surface of the first metal layer, and suppresses the diffusion of a component of the solder into the first metal layer. As a result, as compared with a case where an end of the first metal layer is provided at or in the vicinity of the resonator end faces and is not covered with the second metal layer, the diffusion of the component of the solder to the first metal layer is effectively suppressed.

BRIEF DESCRIPTION OF THE DRAWINGS

FIG. 1 is a diagram illustrating a perspective configuration example of a semiconductor laser according to a first embodiment of the present disclosure.
FIG. 2 is a diagram illustrating a cross-sectional configuration example of the semiconductor laser of FIG. 1 taken along line A-A.
FIG. 3 is a diagram illustrating a cross-sectional configuration example of the semiconductor laser of FIG. 1 taken along line B-B.
FIG. 4 is a diagram illustrating a cross-sectional configuration example of the semiconductor laser of FIG. 1 taken along line C-C.
FIG. 5A is a diagram illustrating an example of a method of manufacturing the semiconductor laser of FIG. 1.
FIG. 5B is a diagram illustrating a cross-sectional configuration example taken along line A-A of FIG. 5A.
FIG. 5C is a diagram illustrating a cross-sectional configuration example taken along line B-B of FIG. 5A.
FIG. 5D is a diagram illustrating a cross-sectional configuration example taken along line C-C of FIG. 5A.
FIG. 6A is a diagram illustrating an example of a manufacturing process following FIG. 5A.
FIG. 6B is a diagram illustrating a cross-sectional configuration example taken along line A-A of FIG. 6A.
FIG. 6C is a diagram illustrating a cross-sectional configuration example taken along line B-B of FIG. 6A.
FIG. 6D is a diagram illustrating a cross-sectional configuration example taken along line C-C of FIG. 6A.
FIG. 7A is a diagram illustrating an example of a manufacturing process following FIG. 6A.
FIG. 7B is a diagram illustrating a cross-sectional configuration example taken along line A-A of FIG. 7A.
FIG. 7C is a diagram illustrating a cross-sectional configuration example taken along line B-B of FIG. 7A.
FIG. 7D is a diagram illustrating a cross-sectional configuration example taken along line C-C of FIG. 7A.
FIG. 8A is a diagram illustrating an example of a manufacturing process following FIG. 7A.
FIG. 8B is a diagram illustrating a cross-sectional configuration example taken along line A-A of FIG. 8A.
FIG. 8C is a diagram illustrating a cross-sectional configuration example taken along line B-B of FIG. 8A.
FIG. 8D is a diagram illustrating a cross-sectional configuration example taken along line C-C of FIG. 8A
FIG. 9 is a diagram illustrating a modification example of the semiconductor laser of FIG. 4.
FIG. 10 is a diagram illustrating a modification example of the semiconductor laser of FIG. 4.
FIG. 11 is a diagram illustrating a modification example of the semiconductor laser of FIG. 4.
FIG. 12 is a diagram illustrating a modification example of the semiconductor laser of FIG. 4.
FIG. 13 is a diagram illustrating a modification example of the semiconductor laser of FIG. 1.

FIG. 14 is a diagram illustrating a cross-sectional configuration example of the semiconductor laser of FIG. 13 taken along line A-A.

FIG. 15 is a diagram illustrating a cross-sectional configuration example of the semiconductor laser of FIG. 13 along line B-B.

FIG. 16 is a diagram illustrating a cross-sectional configuration example of the semiconductor laser of FIG. 13 taken along line C-C.

FIG. 17 is a diagram illustrating a perspective configuration example of a semiconductor laser device according to a second embodiment of the present disclosure.

MODES FOR CARRYING OUT THE INVENTION

Hereinafter, embodiments of the present disclosure are described in detail with reference to drawings. The following description is a specific example of the present disclosure, and the present disclosure is not limited to the following embodiments. In addition, the present disclosure is not limited to the arrangement, dimensions, dimensional ratios, etc., of each component illustrated in each drawing. The description will be made in the following order.

1. First Embodiment (a semiconductor laser)
2. Modification Examples (a semiconductor laser)
3. Second Embodiment (a semiconductor laser device)

1. First Embodiment

[Configuration]

A semiconductor laser 1 according to a first embodiment of the present disclosure will be described. FIG. 1 illustrates a perspective configuration example of a semiconductor laser 1 according to the present embodiment.

The semiconductor laser 1 has a structure in which a semiconductor layer 20, which will be described later, is sandwiched between a pair of resonator end faces S1 and S2 from a resonator direction. In other words, the pair of resonator end faces S1 and S2 are arranged to face each other via a ridge 20 which will be described later. The resonator end face S1 is a front end face from which laser light is emitted to the outside, and the resonator end face S2 is a rear end face opposed to the resonator end face S1. Therefore, the semiconductor laser 1 is a kind of so-called edge emitting semiconductor laser.

The semiconductor laser 1 (a semiconductor layer 20) includes the resonator end faces S1 and S2 facing each other in the resonator direction, and a convex ridge 20A sandwiched between the resonator end faces S1 and S2. In other words, the pair of resonator end faces S1 and S2 are arranged to face each other with the ridge 20A interposed therebetween. The ridge 20A has a strip-like shape extending in the resonator direction. The ridge 20A is formed, for example, by etching away from a surface of a contact layer 26, which will be described later, to the middle of a first upper clad layer 25, which will be described later. That is, a part of the first upper clad layer 25 is formed on both sides of the ridge 20A.

A width of the ridge 20A (a length in a direction orthogonal to the resonator direction) is, for example, 0.5 μm or more and 100 μm or less, and is, for example, 40 μm. A length of the ridge 20A in the resonator direction is, for example, 50 μm or more and 3000 μm or less, for example, 1200 μm. Hereinafter, the width refers to the length in the direction intersecting the resonator direction. In addition, the direction intersecting with the resonator direction is referred to as the "width direction".

One end surface of the ridge 20A is exposed at the resonator end face S1, and the other end surface of the ridge 20A is exposed at the resonator end face S2. The resonator end faces S1 and S2 are faces formed by cleavage. The resonator end faces S1 and S2 function as resonator mirrors, and the ridge 20A functions as an optical waveguide. The resonator end face S1 may be provided with, for example, an antireflection film configured so that the reflectance at the resonator end face S1 is approximately 15%. The resonator end face S2 may be provided with, for example, a multilayer reflective film configured so that the reflectance at the resonator end face S2 is approximately 85%. The semiconductor laser 1 (the semiconductor layer 20) further has a pair of end faces facing each other in the width direction. The pair of end faces are faces formed by cutting by dicing.

An insulating layer 50 is formed on the upper surface of the semiconductor layer 20 excluding the upper surface of the ridge 20A. The insulating layer 50 protects the semiconductor layer 20 and defines a region for injecting a current into the semiconductor layer 20 (that is, a region where the semiconductor layer 20 and the upper electrode layer 30 are in contact with each other). The insulating layer 50 is configured by, for example, an $SiO_2$ layer or SiN layer having a thickness of 10 nm to 500 nm.

FIG. 2 illustrates an example of a cross-sectional configuration of the semiconductor laser 1 of FIG. 1 taken along line A-A. FIG. 3 illustrates a cross-sectional configuration example of the semiconductor laser 1 of FIG. 1 taken along the line B-B. FIG. 4 illustrates an example of the cross-sectional configuration of the semiconductor laser 1 of FIG. 1 taken along line C-C. FIGS. 2 and 3 illustrate an example of a lateral cross-sectional configuration of the semiconductor laser 1. FIG. 4 illustrates a cross-sectional configuration example of a portion of the semiconductor laser 1 in the resonator direction (specifically, in the vicinity of the resonator end face S1).

The semiconductor laser 1 has a semiconductor layer 20 on a substrate 10. The semiconductor layer 20 includes, for example, a lower clad layer 21, a lower guide layer 22, an active layer 23, an upper guide layer 24, a first upper clad layer 25, a contact layer 26, and a second upper clad layer 27 in this order from the substrate 10 side. The upper guide layer 24, the first upper clad layer 25, the contact layer 26, and the second upper clad layer 27 are stacked on the lower guide layer 22 with the active layer 23 interposed therebetween. The semiconductor layer 20 may be further provided with a layer (for example, a buffer layer) other than the layers described above. In addition, in the semiconductor layer 20, for example, the second upper clad layer 27 may be omitted.

The substrate 10 is, for example, a crystal growth substrate used for epitaxial crystal growth of the active layer 23 and the like. The substrate 10, the lower clad layer 21, the lower guide layer 22, the active layer 23, the upper guide layer 24, the first upper clad layer 25, and the contact layer 26 include, for example, a gallium nitride-based semiconductor. The substrate 10 is, for example, a GaN substrate. The lower clad layer 21, the lower guide layer 22, the active layer 23, the upper guide layer 24, the first upper clad layer 25 and the contact layer 26 include, for example, GaN, AlGaN, AlInN, GaInN, AlGaInN, or the like.

The lower clad layer 21 and the lower guide layer 22 contain, for example, silicon (Si) as an n-type impurity. That is, the lower clad layer 21 and the lower guide layer 22 are n-type semiconductor layers. The upper guide layer 24, the first upper clad layer 25, and the contact layer 26 contain, for example, magnesium (Mg), zinc (Zn), etc., as p-type impurities. That is, the upper guide layer 24, the first upper clad layer 25, and the contact layer 26 are p-type semiconductor layers. The active layer 23 has, for example, a quantum well structure. Types of quantum well structures include, for example, a single quantum well structure (QW structure) and a multiple quantum well structure (MQW structure). The quantum well structure has a structure in which well layers and barrier layers are alternately stacked. Examples of combinations of well layers and barrier layers include $(InyGa_{(1-y)}N, GaN)$, $(InyGa_{(1-y)}N, InzGa_{(1-z)}N)$ [where y>z], $(InyGa_{(1-y)}N, AlGaN)$, and the like.

The second upper clad layer 27 is formed in contact with the top of the ridge 20A (specifically, the contact layer 26). The second upper clad layer 27 includes, for example, a transparent conductive material. Examples of the transparent conductive materials include ITO (Indium Tin Oxide), ITiO (Indium Titanium Oxide), AZO ($Al_2O_3$— —ZnO), and IGZO (InGaZnOx). These transparent conductive materials have a higher conductivity than the semiconductor layers forming the ridge 20A and a higher refractive index than the semiconductor layers forming the ridge 20A. Therefore, by using a transparent conductive material for the second upper clad layer 27 and forming the ridge 20A low, it is possible to reduce a driving voltage of the semiconductor laser 1 and improve an optical confinement in a stacking direction.

The semiconductor laser 1 further includes an upper electrode layer 30 on the upper surface side of the semiconductor layer 20 and a lower electrode layer 40 on the rear surface side of the semiconductor layer 20.

The upper electrode layer 30 is formed on the ridge 20A and electrically coupled to the upper surface of the ridge 20A. The upper electrode layer 30 is formed on the ridge 20A via a second upper clad layer 27 formed in contact with the upper surface of the ridge 20A (specifically, the contact layer 26), and is electrically coupled to the contact layer 26. The upper electrode layer 30 has, for example, a pad metal 31, a barrier metal 32, and a bonding metal 33 in this order from the ridge 20A side.

The pad metal 31 is a metal layer for injecting an externally supplied current into the ridge 20A. The pad metal 31 has, for example, a structure in which a Ti layer, a Pt layer, and an Au layer are stacked in this order from the side closer to the ridge 20A. The thickness of the Ti layer is, for example, 2 nm or more and 100 nm or less. The thickness of the Pt layer is, for example, 10 nm or more and 300 nm or less. The thickness of the Au layer is, for example, 10 nm or more and 3000 nm or less. The pad metal 31 may be electrically coupled to the upper surface of the ridge 20A, and its layer structure is not limited to the above structure.

The pad metal 31 is in contact with the second upper clad layer 27 and is electrically coupled to the upper surface of the ridge 20A (specifically, the contact layer 26) via the second upper clad layer 27. The pad metal 31 is formed between the resonator end face S1 and the resonator end face S2. Specifically, the pad metal 31 is formed in a region between the resonator end face S1 and the resonator end face S2, and formed in a region separated from the resonator end faces S1 and S2 by a predetermined gap. That is, the pad metal 31 is not formed in the predetermined region (end region Re1) including the resonator end face S1 and in the predetermined region (end region Re2) including the resonator end face S2. Hereinafter, regions between the resonator end face S1 and the resonator end face S2 where the pad metal 31 is not formed are referred to as end regions Re1 and Re2.

The length of the end region Re1 or the end region Re2 in the resonator direction is, for example, 0.5 μm or more and 100 μm or less. The width of the pad metal 31 is substantially equal to the width of the second upper clad layer 27 or wider than the width of the second upper clad layer 27, for example, 5 μm or more and 100 μm or less. Because the pad metal 31 is sufficiently separated from the resonator end faces S1 and S2 in this way, the pad metal 31 is prevented from protruding from the resonator end faces S1 and S2 or touching the resonator end faces S1 and S2. Moreover, the stress applied to the ridge 20A through the pad metal 31 is reduced as compared with a case where the pad metal 31 is also formed in the end regions Re1 and Re2.

The barrier metal 32 is a metal layer for suppressing a solder component (for example, tin (Sn)) from diffusing from the bonding metal 33 side to the pad metal 31 side by electromigration. If a component of the solder (for example, tin (Sn)) continues to diffuse into the pad metal 31, the edges of the pad metal 31 may suddenly deteriorate. Such sudden deterioration of the pad metal 31 impairs the long-term reliability of the semiconductor laser 1. Therefore, the barrier metal 32 is a layer for ensuring long-term reliability of the semiconductor laser 1.

The barrier metal 32 has, for example, a structure in which a Ti layer and a Pt layer are stacked in this order from the side closer to the ridge 20A, and includes a metal layer that does not have wettability to Sn-based solder. The thickness of the Ti layer is, for example, 2 nm or more and 500 nm or less. The thickness of the Pt layer is, for example, 2 nm or more and 100 nm or less. The pad metal 31 may have a structure capable of suppressing the diffusion of a component of the solder (for example, tin (Sn)) from the bonding metal 33 side to the pad metal 31 side, and its layer configuration is not limited to the configuration described above. The outermost surface of the barrier metal 32 (the surface on the bonding metal 33 side) is preferably includes a metal (for example, Ti, Pt, Al, or Ni) that does not have wettability to the Sn-based solder.

The barrier metal 32 is formed to cover the pad metal 31. Specifically, the barrier metal 32 covers both ends of the pad metal 31 in the direction of the resonator and at least the vicinity of the ends of the pad metal 31 in the formation surface of the pad metal 31 (for example, the insulating layer 50). This prevents direct contact between the pad metal 31 and the bonding metal 33.

The bonding metal 33 is, for example, a metal layer with which solder contacts. The bonding metal 33 has, for example, a structure in which a Ti layer and an Au layer are stacked in this order from the side closer to the ridge 20A. The thickness of the Ti layer is, for example, 2 nm or more and 500 nm or less. The thickness of the Au layer is, for example, 10 nm or more and 1000 nm or less. The outermost surface of the bonding metal 33 is preferably includes a metal (for example, Au, Ag, or Pd) having wettability to the Sn-based solder.

The bonding metal 33 is formed in contact with the surface of the barrier metal 32. The bonding metal 33 is formed between the resonator end face S1 and the resonator end face S2. Specifically, the bonding metal 33 is formed in a region between the resonator end face S1 and the resonator end face S2, and in a region separated from the resonator end faces S1 and S2 by a predetermined gap. That is, the bonding metal 33 is not formed in the predetermined region (end region Re1) including the resonator end face S1 and in the predetermined region (end region Re2) including the reso-
nator end face S2. Because the bonding metal 33 is suffi-
ciently separated from the resonator end faces S1 and S2 in
this manner, the bonding metal 33 is prevented from pro-
truding from the resonator end faces S1 and S2 or touching
the resonator end faces S1 and S2. Moreover, the stress
applied to the ridge 20A through the bonding metal 33 is
reduced as compared with the case where the bonding metal
33 is also formed in the end regions Re1 and Re2.

The lower electrode layer 40 is formed, for example, in
contact with the back surface of the substrate 10. The lower
electrode layer 40 has, for example, a structure in which a Ti
layer and an Al layer are stacked in this order from the side
closer to the substrate 10. The lower electrode layer 40 may
be electrically coupled to the substrate 10, and its layer
configuration is not limited to the above configuration.
Further, the lower electrode layer 40 may be in contact with
the entire back surface of the substrate 10 or may be in
contact with only a part of the back surface of the substrate
10.

[Manufacturing Method]

Next, a manufacturing method of the semiconductor laser
1 will be described with reference to FIGS. 5A, 5B, 5C, 5D,
6A, 6B, 6C, 6D, 7A, 7B, 7C, 7D, 8A, 8B, 8C, and 8D. FIG.
5A illustrates a planar configuration example of a portion of
a wafer in the manufacturing process of the semiconductor
laser 1. FIG. 5B illustrates a cross-sectional configuration
example taken along line A-A in FIG. 5A. FIG. 5C illustrates
a cross-sectional configuration example taken along line
B-B of FIG. 5A. FIG. 5D illustrates a cross-sectional con-
figuration example taken along line C-C of FIG. 5A. FIG.
6A illustrates an example of the manufacturing process
following FIG. 5A. FIG. 6B illustrates a cross-sectional
configuration example taken along line A-A of FIG. 6A.
FIG. 6C illustrates a cross-sectional configuration example
taken along line B-B of FIG. 6A. FIG. 6D illustrates a
cross-sectional configuration example taken along line C-C
of FIG. 6A. FIG. 7A illustrates an example of the manufac-
turing process following FIG. 6A. FIG. 7B illustrates a
cross-sectional configuration example taken along line A-A
of FIG. 7A. FIG. 7C illustrates a cross-sectional configura-
tion example taken along line B-B of FIG. 7A. FIG. 7D
illustrates a cross-sectional configuration example taken
along line C-C of FIG. 7A. FIG. 8A illustrates an example
of the manufacturing process following FIG. 7A. FIG. 8B
illustrates a cross-sectional configuration example taken
along line A-A of FIG. 8A. FIG. 8C illustrates a cross-
sectional configuration example taken along line B-B of
FIG. 8A. FIG. 8D illustrates a cross-sectional configuration
example taken along line C-C of FIG. 8A. In FIGS. 5A, 5B,
6A, 6B, 7A, 7B, 8A, and 8B, both side surfaces correspond
to locations where the wafer is to be cleaved.

In order to manufacture the semiconductor laser 1, a
compound semiconductor is collectively formed on a sub-
strate 10 that includes GaN by an epitaxial crystal growth
method such as MOCVD (Metal Organic Chemical Vapor
Deposition). At this time, as raw materials for the compound
semiconductor, for example, trimethylgallium $((CH_3)_3Ga)$ is
used as a raw material gas for gallium, trimethylaluminum
$((CH_3)_3Al)$ is used as a raw material gas for aluminum, and
for example, trimethylindium $((CH_3)_3In)$ is used as a raw
material gas for indium. In addition, ammonia $(NH_3)$ is used
as a raw material gas for nitrogen. Further, monosilane
$(SiH_4)$, for example, is used as the raw material gas for
silicon, and bis=cyclopentadienylmagnesium $((C_5H_5)_2Mg)$, for example, is used as the raw material gas for magnesium.
As a result, the lower clad layer 21 to contact layer 26 are
formed on the substrate 10.

Next, a resist coat film is formed on the contact layer 26
with an opening corresponding to a region where the second
upper clad layer 27 is to be formed, and the second upper
clad layer 27 is formed by, for example, vacuum deposition
or sputtering. Subsequently, at least a part of the second
upper clad layer 27, the contact layer 26, and the first upper
clad layer 25 are removed by etching, for example, by RIE.

As a result, the ridge 20A is formed, and the second upper
clad layer 27 is formed on the ridge 20A. Subsequently, after
forming an insulating layer on the entire surface including
the second upper clad layer 27 by using, for example,
vacuum deposition or sputtering, an insulating layer 50
having an opening at a location facing the second upper clad
layer 27 is formed by patterning using, for example, RIE or
a solution containing hydrogen fluoride (FIGS. 5A, 5B, 5C,
and 5D).

Next, after forming a metal layer for forming the pad
metal 31 on the surfaces of the second upper clad layer 27
and the insulating layer 50 by, for example, a vacuum
deposition method or a sputtering method, for example, by
performing a lift-off method, a pad metal 31 is formed
(FIGS. 6A, 6B, 6C, and 6D). At this time, the pad metal 31
is formed in a region between the resonator end faces S1 and
S2 and separated from the resonator end faces S1 and S2 by
a predetermined gap. The pad metal 31 may be formed using
the RIE method or the milling method instead of the lift-off
method.

Next, after forming a metal layer for forming the barrier
metal 32 on the surface including the pad metal 31 by, for
example, a vacuum deposition method or a sputtering
method, the barrier metal 32 is formed by performing, for
example, a lift-off method (FIGS. 7A, 7B, 7C, and 7D). At
this time, the barrier metal 32 is formed so as to cover the
pad metal 31. The barrier metal 32 may be formed using the
RIE method or the milling method instead of the lift-off
method.

Next, after forming a metal layer for forming the bonding
metal 33 on the surface of the barrier metal 32 by, for
example, a vacuum deposition method or a sputtering
method, the bonding metal 33 is formed by performing, for
example, a lift-off method (FIGS. 8A, 8B, 8C, and 8D). At
this time, the bonding metal 33 is formed in a region
between the resonator end faces S1 and S2 and separated
from the resonator end faces S1 and S2 by a predetermined
gap. The bonding metal 33 may be formed using the RIE
method or the milling method instead of the lift-off method.

Next, after forming a metal layer for forming the lower
electrode layer 40 on the back surface of the substrate 10 by,
for example, a vacuum deposition method or a sputtering
method, the lower electrode layer 40 is formed by, for
example, a lift-off method. Next, the substrate 10 is cut into
bars, and if necessary, a coating film is formed on the
exposed end faces to control the reflectance. Furthermore,
the semiconductor laser 1 is produced by cutting out ele-
ments from the bar-shaped substrate 10 and forming chips.

Operation

In the semiconductor laser 1 configured as described
above, when a predetermined voltage is applied between the
upper electrode layer 30 and the lower electrode layer 40, a
current is injected into the active layer 23 through the ridge
20A. Light emission occurs due to recombination of elec-
trons and holes. This light is reflected by the pair of resonator end faces S1 and S2 and confined by the lower clad layer 21, the first upper clad layer 25, and the second upper clad layer 27, thereby causing laser oscillation at a predetermined oscillation wavelength. At this time, an optical waveguide region in which the oscillated laser light is guided is formed in the semiconductor layer 20. The optical waveguide region is formed in a region immediately below the ridge 20A with the active layer 23 at the center. Laser light having a predetermined oscillation wavelength is emitted to the outside from one resonator end face S1.

Effects

Next, effects of the semiconductor laser 1 will be described.

In an edge-emitting semiconductor laser, a semiconductor laser is fixed to a heat exhaust member such as a heat sink by a solder in order to suppress output reduction due to heat generation. At this time, a component of the solder may diffuse into the electrode layer of the semiconductor laser, degrading the long-term reliability of the semiconductor laser.

In contrast, in the present embodiment, the upper electrode layer 30 electrically coupled to the upper surface of ridge 20A (specifically, the contact layer 26) includes the pad metal 31 and the barrier metal 32. Here, the pad metal 31 is formed relatively on the ridge 20A side, in a region between the pair of resonator end faces S1 and S2, and formed away from the pair of resonator end faces S1 and S2. Furthermore, the barrier metal 32 covers the entire surface of the pad metal 31, thereby suppressing diffusion of a component of the solder to the pad metal 31. As a result, as compared with a case where the end portions of the pad metal 31 are provided close to the resonator end faces S1 and S2 and are not covered with the barrier metal 32, the diffusion of the solder component to the pad metal 31 is more effectively suppressed. As a result, it is possible to suppress the deterioration in the long-term reliability due to the solder.

Further, in the present embodiment, in a case where the pad metal 31 includes an Au layer and the barrier metal 32 includes a Ti layer but does not include an Au layer, it is possible to prevent the Au layer from protruding from the resonator end faces S1 and S2 and contacting with the resonator end faces S1 and S2.

Further, in the present embodiment, the upper electrode layer 30 further includes the bonding metal 33 in addition to the pad metal 31 and the barrier metal 32. Here, the bonding metal 33 is formed in contact with the surface of the barrier metal 32 and is formed away from the resonator end faces S1 and S2. As a result, it is possible to suppress the diffusion of the solder component to the pad metal 31 effectively as compared with a case where the end portions of the bonding metal 33 are provided close to the resonator end faces S1 and S2. As a result, it is possible to suppress the deterioration in the long-term reliability due to the solder.

Further, in the present embodiment, in a case where the bonding metal 33 includes an Au layer, the Au layer is prevented from protruding from the resonator end faces S1 and S2 and contacting the resonator end faces S1 and S2.

2. Modification Examples

Next, modification examples of the semiconductor laser 1 according to the above embodiment will be described.

Modification Example A

FIG. 9 illustrates a modification example of the semiconductor laser 1 of FIG. 4. In the above embodiment, the ends of the barrier metal 32 do not have to cover the resonator ends (portions in the vicinity of the resonator end faces S1 and S2) as illustrated in FIG. 9, for example. Even in such a case, it is possible to achieve the similar effects to those of the above-described embodiment.

Modification Example B

FIG. 10 illustrates a modification example of the semiconductor laser 1 of FIG. 4. In the above embodiment, for example, as illustrated in FIG. 10, the bonding metal 33 may cover the resonator end portions (portions in the vicinity of the resonator end faces S1 and S2). Even in this case, it is possible to effectively suppress the diffusion of the solder component to the pad metal 31 as compared with a case where the ends of the pad metal 31 are provided close to the resonator end faces S1 and S2 and are not covered with the barrier metal 32. As a result, it is possible to suppress the deterioration in the long-term reliability due to the solder.

Modification Example C

FIG. 11 illustrates a modification example of the semiconductor laser 1 of FIG. 4. In the above embodiments and the modification examples thereof, for example, as illustrated in FIG. 11, an isolation metal 34 may be provided between the second upper clad layer 27 and the pad metal 31 and the barrier metal 32. The isolation metal 34 has an effect of improving a bonding strength between the second upper clad layer 27 and the pad metal 31 and the barrier metal 32. The isolation metal 34 is formed by vacuum deposition or sputtering, for example. In a case where the isolation metal 34 is provided, it is possible to suppress peeling of the pad metal 31 and the barrier metal 32 from the second upper clad layer 27.

Modification Example D

FIG. 12 illustrates a modification example of the semiconductor laser 1 of FIG. 4. In the above-described embodiment and the modification examples thereof, for example, as illustrated in FIG. 12, an insulating film 60 may be provided between the second upper clad layer 27 and the pad metal 31 and the barrier metal 32 and in the end regions Re1 and Te2. The insulating film 60 is configured by, for example, an $SiO_2$ layer, an SiN layer, or the like. As a result, a current is not directly injected from the upper electrode layer 30 into the semiconductor layer 20 in the vicinity of the resonator end faces S1 and S2, making it possible to suppress the oscillation from being destabilized due to the current flowing in the vicinity of the resonator end faces S1 and S2. That is, in this modification example, window structures are provided at both ends of the ridge 20A.

Modification Example E

FIG. 13 illustrates a modification example of the semiconductor laser 1 of FIG. 1. FIG. 14 illustrates a cross-sectional configuration example of the semiconductor laser 1 of FIG. 13 taken along the line A-A. FIG. 15 illustrates a cross-sectional configuration example of the semiconductor laser 1 of FIG. 13 taken along line B-B. FIG. 16 illustrates an example of the cross-sectional configuration of the semiconductor laser 1 of FIG. 13 along line C-C.

In the above embodiment and the modification examples thereof, for example, as illustrated in FIGS. 13 to 15, pedestal portions 20B for protecting the ridge 20A may be provided on both sides of the ridge 20A. For example, as illustrated in FIGS. 13 to 15, the pedestal portion 20B may have a configuration in which the second upper clad layer 27 is omitted from the ridge 20A and the outermost surface is covered with the insulating layer 50. Thereby, it is possible to prevent a current from flowing from the upper electrode layer 30 to the semiconductor layer 20 in the pedestal portion 20B.

3. Second Embodiment

[Configuration]

A semiconductor laser device 2 according to a second embodiment of the present disclosure will be described. FIG. 17 illustrates a cross-sectional configuration example of the semiconductor laser device 2 according to the present embodiment.

The semiconductor laser device 2 includes a semiconductor laser 1 provided with a ridge 20A, a submount 70, and cylindrical leads 80 and 90. In the present embodiment, the semiconductor laser 1 is mounted on the upper surface of the submount 70 with the surface on which the plurality of ridges 20A are formed facing the submount 70 side. That is, the semiconductor laser 1 is mounted on the upper surface of the submount 70 with the junction down. Connection pads 71 are provided on the upper surface of the submount 70.

The upper electrode layer 30 (specifically, the bonding metal 33) of the semiconductor laser 1 is electrically coupled to the connection pads 71 of the submount 70 via a solder 72. The bonding metal 33 is in contact with the solder 72. The connection pads 71 are electrically coupled to the cylindrical leads 90 via bonding wires 91. A lower electrode layer 40 of the semiconductor laser 1 is electrically coupled to a cylindrical lead 80 via a bonding wire 81. The bonding wire 91 is connected to the connection pad 71 and the cylindrical lead 90 by, for example, forming the end of the bonding wire 91 into a ball shape and applying ultrasonic waves and heat to the ball-shaped end. The bonding wire 81 is connected to the lower electrode layer 40 and the cylindrical lead 80 by, for example, forming the end of the bonding wire 81 into a ball shape and applying ultrasonic waves and heat to the ball-shaped end. The solder 72 includes, for example, a Sn-based solder material.

In the present embodiment, the upper electrode layer 30 electrically coupled to the upper surface of ridge 20A (specifically, the contact layer 26) includes the pad metal 31 and the barrier metal 32 as with the above-described embodiment. As a result, as compared with a case where the end portions of the pad metal 31 are provided close to the resonator end faces S1 and S2 and are not covered with the barrier metal 32, the diffusion of the component of the solder 72 into the pad metal 31 is effectively suppressed. As a result, it is possible to suppress the deterioration in the long-term reliability due to the solder 72.

Further, in the present embodiment, the upper electrode layer 30 further includes the bonding metal 33 in addition to the pad metal 31 and the barrier metal 32 as with the above-described embodiment. As a result, it is possible to effectively suppress the component of the solder 72 from diffusing into the pad metal 31 as compared with a case where the end portions of the bonding metal 33 are provided close to the resonator end faces S1 and S2. As a result, it is possible to suppress the deterioration in the long-term reliability due to the solder 72.

Although the present disclosure has been described with reference to the embodiments and the modification examples, the present disclosure is not limited to the above-described embodiments and the like, and various modifications are possible. It should be noted that the effects described in this specification are merely examples. The effects of the present disclosure are not limited to the effects described herein. The present disclosure may have effects other than those described herein.

Further, for example, the present disclosure may have the following configurations.

(1)

A semiconductor laser including:

a first semiconductor layer of a first conductivity type;

an active layer;

a second semiconductor layer of a second conductivity type stacked on the first semiconductor layer with the active layer interposed therebetween, and provided with a strip-shaped ridge;

a pair of resonator end faces facing each other across the ridge; and an electrode layer electrically coupled to an upper surface of the ridge, in which the electrode layer includes, in this order from the ridge side, a first metal layer formed in a region between the pair of resonator end faces and formed away from the pair of resonator end faces, and a second metal layer that covers an entire surface of the first metal layer, and suppresses a diffusion of a component of a solder into the first metal layer.

(2)

The semiconductor laser according to (1), in which the first metal layer includes an Au layer, and the second metal layer includes a metal layer having no wettability to the Sn-based solder.

(3)

The semiconductor laser according to (1) or (2), in which the electrode layer further includes a third metal layer formed in contact with a surface of the second metal layer and formed away from the pair of resonator end faces.

(4)

The semiconductor laser according to (3), in which the third metal layer includes an Au layer.

(5)

A semiconductor laser device including:

a semiconductor laser; and a connection pad electrically coupled to the semiconductor laser via a solder, the semiconductor laser including a first semiconductor layer of a first conductivity type, an active layer, a second semiconductor layer of a second conductivity type stacked on the first semiconductor layer with the active layer interposed therebetween, and provided with a strip-shaped ridge, a pair of resonator end faces facing each other across the ridge, and an electrode layer electrically coupled to an upper surface of the ridge, in which the electrode layer includes, in this order from the ridge side, a first metal layer formed in a region between the pair of resonator end faces and formed away from the pair of resonator end faces, and a second metal layer that covers an entire surface of the first metal layer, and suppresses a diffusion of a component of the solder into the first metal layer.

(6)

The semiconductor laser device according to (5), in which the electrode layer further includes a third metal layer formed in contact with a surface of the second metal layer and formed away from the pair of resonator end faces, and the third metal layer is in contact with the solder.

In the semiconductor laser and the semiconductor laser device according to one embodiment of the present disclosure, the electrode layer electrically coupled to the upper surface of the ridge includes the first metal layer and the second metal layer. Here, the first metal layer is formed relatively on the ridge side, and formed in a region between the pair of resonator end faces and away from the pair of resonator end faces. The second metal layer covers the entire surface of the first metal layer, and suppresses the diffusion of a component of the solder into the first metal layer. As a result, as compared with a case where an end of the first metal layer is provided at or near the resonator end faces and is not covered with the second metal layer, the diffusion of the component of the solder to the first metal layer is effectively suppressed. As a result, it is possible to suppress the deterioration in the long-term reliability due to the solder. Note that the effects of the present disclosure are not necessarily limited to the effects described herein, and may be any of the effects described herein.

The present application claims the benefit of Japanese Priority Patent Application JP2020-124038 filed with the Japan Patent Office on Jul. 20, 2020, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor laser, comprising:
a first semiconductor layer of a first conductivity type;
an active layer;
a second semiconductor layer of a second conductivity type, wherein
the second semiconductor layer is on the first semiconductor layer,
the active layer is between the first semiconductor layer and the second semiconductor layer, and
the second semiconductor layer includes a strip-shaped ridge;
a pair of resonator end faces across the strip-shaped ridge, wherein the pair of resonator end faces includes:
a first resonator end face, and
a second resonator end face that faces the first resonator end face; and
an electrode layer electrically coupled to an upper surface of the strip-shaped ridge, wherein
the electrode layer includes a first metal layer and a second metal layer,
the second metal layer is on the first metal layer from a side of the strip-shaped ridge,
the first metal layer is in a first region between the pair of resonator end faces,
the first metal layer is away from a second region that includes at least one of the first resonator end face or the second resonator end face, the second metal layer covers an entire surface of the first metal layer and the second region, and
the second metal layer suppresses a diffusion of a component of a solder into the first metal layer.

2. The semiconductor laser according to claim 1, wherein
the first metal layer includes a gold (Au) layer, and
the second metal layer includes a metal layer that is non-wettable to a tin (Sn)-based solder.

3. The semiconductor laser according to claim 1, wherein
the electrode layer further includes a third metal layer,
the third metal layer is in contact with a surface of the second metal layer, and
the third metal layer is away from the second region.

4. The semiconductor laser according to claim 3, wherein the third metal layer includes a gold (Au) layer.

5. A semiconductor laser device, comprising:
a semiconductor laser; and
a connection pad electrically coupled to the semiconductor laser via a solder, wherein the semiconductor laser includes:
a first semiconductor layer of a first conductivity type;
an active layer;
a second semiconductor layer of a second conductivity type, wherein
the second semiconductor layer is on the first semiconductor layer,
the active layer is between the first semiconductor layer and the second semiconductor layer, and
the second semiconductor layer includes a strip-shaped ridge:
a pair of resonator end faces across the strip-shaped ridge, wherein the pair of resonator end faces includes:
a first resonator end face, and
a second resonator end face that faces the first resonator end face; and
an electrode layer electrically coupled to an upper surface of the strip-shaped ridge, wherein
the electrode layer includes a first metal layer and a second metal layer,
the second metal layer is on the first metal layer from a side of the strip-shaped ridge,
the first metal layer is in a first region between the pair of resonator end faces,
the first metal layer is away from a second region that includes at least one of the first resonator end face or the second resonator end face,
the second metal layer covers an entire surface of the first metal layer and the second region, and
the second metal layer suppresses a diffusion of a component of the solder into the first metal layer.

6. The semiconductor laser device according to claim 5, wherein
the electrode layer further includes a third metal layer,
the third metal layer is in contact with a surface of the second metal layer,
the third metal layer is away from the second region, and
the third metal layer is in contact with the solder.

* * * * *